(12) United States Patent
Reilly

(10) Patent No.: US 11,464,135 B2
(45) Date of Patent: Oct. 4, 2022

(54) LIQUID COOLING ENCLOSURE FOR CIRCUIT COMPONENTS

(71) Applicant: SCHNEIDER ELECTRIC IT CORPORATION, Foxboro, MA (US)

(72) Inventor: David E. Reilly, Concord, MA (US)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 0 days.

(21) Appl. No.: 17/111,592

(22) Filed: Dec. 4, 2020

(65) Prior Publication Data

US 2022/0183183 A1 Jun. 9, 2022

(51) Int. Cl.
  *H05K 7/20* (2006.01)
  *H05K 1/02* (2006.01)

(52) U.S. Cl.
  CPC ..... *H05K 7/20272* (2013.01); *H05K 7/20509* (2013.01); *H05K 1/0203* (2013.01); *H05K 7/20254* (2013.01)

(58) Field of Classification Search
  None
  See application file for complete search history.

(56) References Cited

U.S. PATENT DOCUMENTS

| | | | | |
|---|---|---|---|---|
| 5,163,499 A * | 11/1992 | Newkirk | ............... | C04B 35/652 |
| | | | | 257/E23.005 |
| 6,992,272 B2 * | 1/2006 | Kitano | .................. | F28D 15/02 |
| | | | | 165/90 |
| 7,379,301 B2 * | 5/2008 | Liu | ........................ | H01L 23/473 |
| | | | | 165/104.31 |
| 7,396,326 B2 * | 7/2008 | Ghiron | ................... | A61N 2/006 |
| | | | | 600/13 |
| 7,965,508 B2 * | 6/2011 | Yamamoto | ............ | H01L 25/117 |
| | | | | 361/699 |
| 8,395,896 B2 * | 3/2013 | Belady | ................. | H05K 7/2079 |
| | | | | 361/698 |
| 8,988,881 B2 * | 3/2015 | Koplow | .............. | F28D 15/0275 |
| | | | | 361/707 |
| 10,212,849 B2 * | 2/2019 | Matsumoto | ........ | H05K 7/20236 |
| 10,412,860 B1 * | 9/2019 | Goldsmith | ......... | H05K 7/20772 |
| 10,624,236 B2 * | 4/2020 | Inano | ................. | H05K 7/20272 |
| 11,199,192 B1 * | 12/2021 | Franz | .................... | F04D 19/002 |
| 2008/0253085 A1 * | 10/2008 | Soffer | ....................... | G06F 1/18 |
| | | | | 361/679.4 |
| 2011/0227681 A1 | 9/2011 | MacLennan | | |
| 2015/0029765 A1 * | 1/2015 | MacLennan | .......... | H01F 27/306 |
| | | | | 363/39 |

\* cited by examiner

*Primary Examiner* — Courtney L Smith
(74) *Attorney, Agent, or Firm* — Lando & Anastasi, LLP

(57) ABSTRACT

A liquid cooling enclosure configured to house and cool at least one circuit component, the liquid cooling enclosure including an inner wall, an outer wall, the outer wall being spaced from the inner wall to form an internal channel, an inlet in fluid communication with the internal channel, the inlet being configured to receive cooling liquid, and an outlet in fluid communication with the internal channel, the outlet being configured to return cooling liquid, wherein the at least one circuit component is positioned within the liquid cooling enclosure and the cooling liquid is circulated around the at least one circuit component via the internal channel.

22 Claims, 7 Drawing Sheets

LIQUID COOLING ENCLOSURE FOR CIRCUIT COMPONENTS

BACKGROUND OF INVENTION

Field of the Invention

Embodiments of the disclosure generally relate to liquid cooling systems, and more particularly, to the use of liquid cooling for circuit components.

Discussion of Related Art

Many circuit components generate heat during operation and require a method of cooling to prevent the circuit components from overheating. One such method is liquid cooling, which involves mounting one side or section of the circuit component to a thermally conductive channel which contains a cooling liquid. Heat produced by the circuit component can be transferred to the cooling fluid, allowing the operating temperature of the circuit component to be reduced.

SUMMARY

At least one aspect of the present disclosure is directed to a liquid cooling enclosure configured to house and cool at least one circuit component. The liquid cooling enclosure includes an inner wall, an outer wall, the outer wall being spaced from the inner wall to form an internal channel, an inlet in fluid communication with the internal channel, the inlet being configured to receive cooling liquid, and an outlet in fluid communication with the internal channel, the outlet being configured to return cooling liquid, wherein the at least one circuit component is positioned within the liquid cooling enclosure and the cooling liquid is circulated around the at least one circuit component via the internal channel.

In one embodiment, at least one of the inner wall or the outer wall is fabricated from aluminum. In some embodiments, a first circumference of the inner wall is less than a second circumference of the outer wall. In various embodiments, the at least one circuit component is thermally coupled to the inner wall. In certain embodiments, the at least one circuit component is thermally coupled to the inner wall using a thermally conductive epoxy.

In some embodiments, the liquid cooling enclosure includes an enclosure base connected to the inner wall and the outer wall. In one embodiment, the at least one circuit component is positioned within the liquid cooling enclosure on the enclosure base. In various embodiments, at least one side of the enclosure base is thermally coupled to at least one of the inner wall, the outer wall, or the at least one circuit component. In certain embodiments, at least one side of the enclosure base is configured to be secured to at least one of a cold plate or a printed circuit board.

In various embodiments, the outlet is configured to be connected to a heat exchanger. In one embodiment, the outlet is configured to be connected to an inlet of a second liquid cooling enclosure. In some embodiments, the inlet is connected to the outer wall through an inlet opening formed at a non-perpendicular angle with respect to a tangent of the outer wall at a center of the inlet opening. In certain embodiments, the outlet is connected to the outer wall through an outlet opening formed at a non-perpendicular angle with respect to a tangent of the outer wall at a center of the outlet opening.

Another aspect of the present disclosure is directed to a method of assembling a liquid cooling enclosure configured to house at least one circuit component. The method includes arranging a first wall inside of a second wall to form an internal channel, connecting an inlet to the internal channel, the inlet being configured to provide a cooling liquid to the internal channel, connecting an outlet to the internal channel, the outlet being configured to return the cooling liquid after passing through the internal channel, and positioning the at least one circuit component within the first and second walls, wherein the cooling liquid is circulated around the at least one circuit component via the internal channel.

In one embodiment, the method includes thermally coupling the at least one circuit component to the first wall. In some embodiments, the method includes connecting the first and second walls to an enclosure base. In various embodiments, the method includes thermally coupling the enclosure base to at least one of first wall, the second wall, or the at least one circuit component. In certain embodiments, the method includes securing an enclosure base to at least one of a cold plate or a printed circuit board.

In some embodiments, the method includes connecting the inlet to at least one pump configured to circulate the cooling liquid through the internal channel. In one embodiment, the method includes connecting the outlet to a heat exchanger configured to transfer heat generated by the at least one circuit component from the cooling liquid. In various embodiments, the method includes connecting the outlet to an inlet of a second liquid cooling enclosure.

In certain embodiments, the inlet is connected to the internal channel through an inlet opening formed at an angle with respect to a tangent of the outer wall. In some embodiments, the outlet is connected to the internal channel through an outlet opening formed at an angle with respect to a tangent of the outer wall.

Another aspect of the present disclosure is directed to a liquid cooling system for cooling a plurality of circuit components. The liquid cooling system includes a pump configured to provide cooling liquid, a heat exchanger configured to transfer heat generated by the plurality of circuit components from the cooling liquid, and a plurality of liquid cooling enclosures connected in series, each liquid cooling enclosure including an inlet configured to receive cooling liquid, an internal channel configured to circulate cooling liquid around at least one circuit component of the plurality of circuit components, and an outlet configured to return cooling liquid, wherein the pump is connected to the inlet of a first liquid cooling enclosure of the plurality of liquid cooling enclosures and the heat exchanger is connected to the outlet of a second liquid cooling enclosure of the plurality of liquid cooling enclosures.

BRIEF DESCRIPTION OF DRAWINGS

Various aspects of at least one embodiment are discussed below with reference to the accompanying drawings, which are not intended to be drawn to scale. The drawings are included to provide illustration and a further understanding of the various aspects and embodiments and are incorporated in and constitute a part of this specification but are not intended as a definition of the limits of the disclosure. In the drawings, each identical or nearly identical component that is illustrated in various figures may be represented by a like numeral. For purposes of clarity, not every component may be labeled in every drawing. In the drawings.

DETAILED DESCRIPTION

Figure 1A:
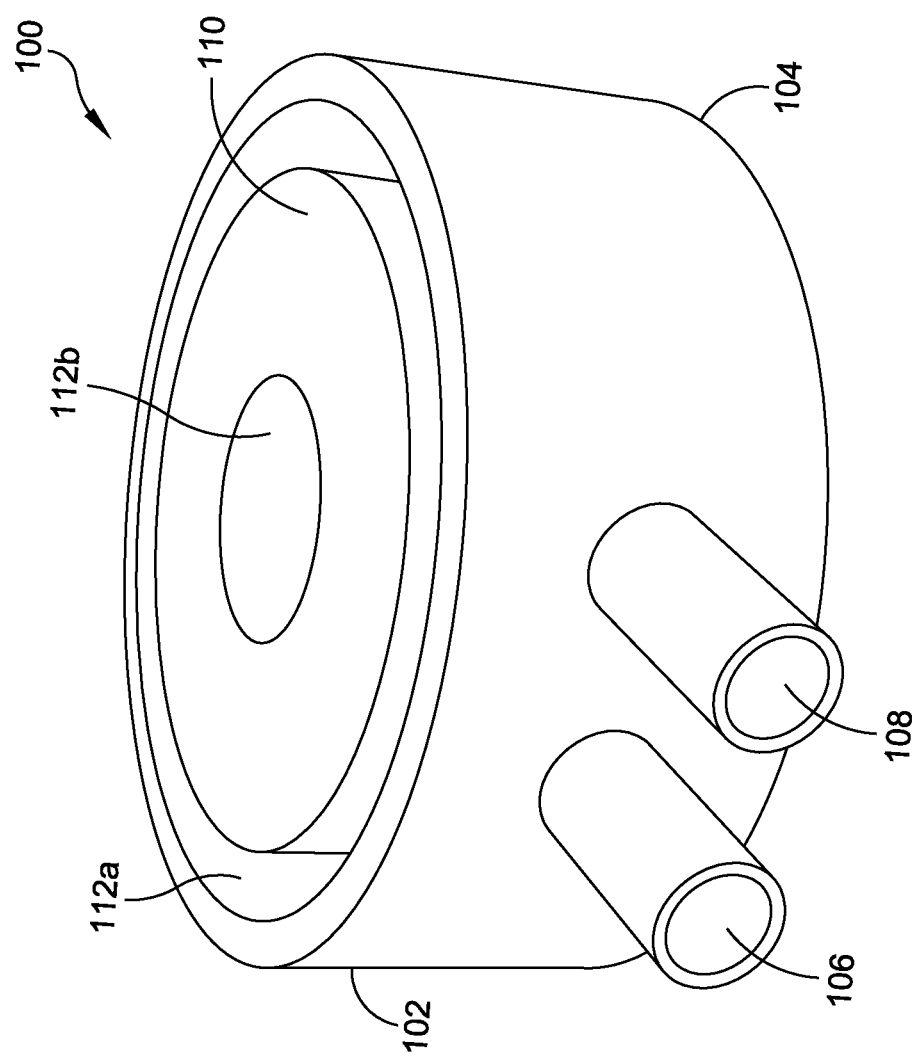
FIG. 1A is a diagram illustrating a perspective view of a liquid cooling enclosure according to one embodiment.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

As discussed above, circuit components can generate significant amounts of heat. In order to maintain component functionality, the operating temperature of the component is often maintained at an acceptable or desired operating temperature using various cooling methods. Some examples include allowing heat to be transferred via a heatsink. Other examples include circulating air through or in proximity to the component. While these cooling methods have proven to be effective for some circuit components, for many components such methods are inadequate for maintaining an acceptable operating temperature.

As a result, demand has increased for efficient high-performance cooling methods. One such method is known as liquid cooling. The liquid cooling method includes mounting a side or edge of the circuit component to a thermally conductive channel which contains a cooling liquid. The cooling liquid is then pumped through the channel to transfer heat from the component. However, since a side or edge of the circuit component is mounted to the conductive channel, only a portion of the circuit component is closely coupled (thermally) to the channel. Such circuit components can have multiple heat producing areas, and the transfer of heat via a single thermally coupled side or edge may be insufficient for maintaining an acceptable operating temperature. In addition, many circuit components have unique and/or complex shapes that are difficult to mount to the conductive channel.

An improved liquid cooling enclosure for circuit components is provided herein. In at least one embodiment, the enclosure includes an internal channel that surrounds one or more circuit components positioned at the base of the enclosure. In some examples, a cooling liquid is circulated around the one or more circuit components via the internal channel to transfer heat generated by the one or more circuit components.

FIG. 1A illustrates a liquid cooling enclosure generally indicated at 100 in accordance with aspects described herein. In one example, the enclosure 100 includes an enclosure wall 102, a base 104, an inlet 106, and an outlet 108. As shown, the enclosure wall 102 is connected to the base 104 to provide a "cup" shaped structure that houses a circuit component 110.

The circuit component 110 may be a magnetic component (e.g., toroid, inductor, etc.), a capacitive component (e.g., electrolytic capacitor), a resistive component (e.g., power resistor), or an integrated circuit (IC) component. In one example, the circuit component 110 is a single component; however, in other examples, the circuit component 110 may be two or more components located in proximity (i.e., within the enclosure wall 102) with one another.

In some examples, the enclosure wall 102 is fabricated from a thermally conductive material (e.g., aluminum, copper, etc.). The enclosure wall 102 includes an internal channel connected to the inlet 106 and the outlet 108. In one example, the internal channel is configured to receive cooling liquid via the inlet 106, circulate the cooling liquid around the circuit component 110, and return the cooling liquid to the outlet 108. The internal channel of the enclosure wall 102 is described in greater detail below with respect to FIG. 2.

In some examples, a first cavity 112*a* formed by the enclosure wall 102, the base 104, and the circuit component 110 is filled with a thermally conductive epoxy. As such, the circuit component 110 may be thermally coupled to the enclosure wall 102 and heat generated by the circuit component 110 can be transferred via the enclosure wall 102 to the cooling liquid circulating in the internal channel. In certain examples, a second cavity 112*b* formed by the base 104 and the circuit component 110 is also filled with thermally conductive epoxy.

In one example, the base 104 is attached, mounted, and/or bonded to an electronic substrate, such as a printed circuit board (PCB). The base 104 can include cut-outs or openings for pins or leads of the circuit component 110. The pins or leads may extend out of the enclosure 100 and connect to traces or other components on the PCB. In some examples, the base 104 is fabricated from a thermally conductive material (e.g., aluminum, copper, etc.). As such, the base 104 can be connected or coupled to a cold plate such that heat generated by the circuit component 110 is transferred through the base 104 to the cold plate. In other examples, the base 104 is made from a mesh material, allowing the pins and/or leads of the circuit component 110 to extend through openings in the mesh material.

While not shown, the enclosure 100 may include a lid connected to the enclosure wall 102 above the circuit component 110. In one example, the lid is fabricated from a thermally conductive material (e.g., aluminum, copper, etc.) and configured to transfer heat from the circuit component 110. For example, the lid can be connected or coupled to a cold plate such that heat generated by the circuit component 110 is transferred through the lid to the cold plate. In other examples, the lid may be optional or made from a mesh material, allowing heat generated by the circuit component 110 to exit the enclosure 100. In various examples, at least one of the enclosure wall 102, the base 104, and the lid (if included) can be coupled to a ground connection.

In some examples, similar to the base 104, the lid can be attached, mounted, and/or bonded to a PCB. In certain examples, the lid is attached and/or bonded to a different PCB than the base 104. For example, the base 104 may be attached to a first PCB (or cold plate attached to the first PCB) and the lid may be attached to a second PCB (or cold plate attached to the second PCB). In one example, the second PCB is stacked above the first PCB. As such, the pins or leads of the circuit component 110 can extend out of the enclosure 100 through the base 104 and/or the lid. The pins or leads may connect to traces or other components on the first PCB and/or the second PCB.

Figure 1B:
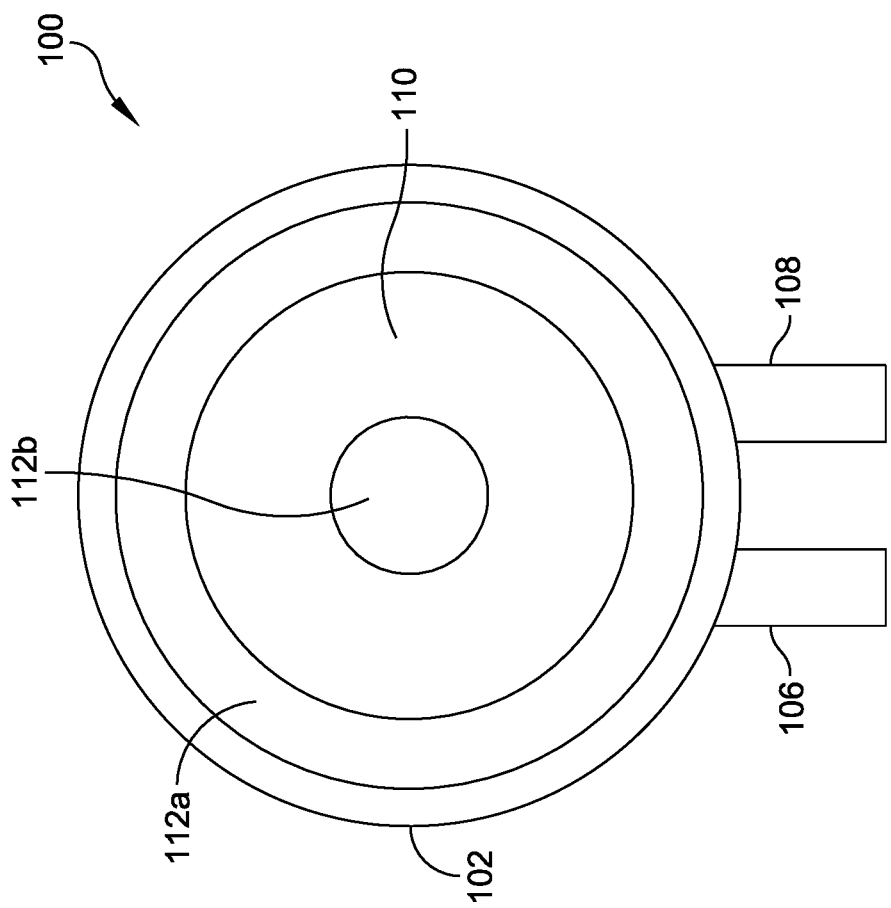
FIG. 1B is a diagram illustrating a top plan view of a liquid cooling enclosure according to one embodiment.

FIG. 1B illustrates a top plan view of the liquid cooling enclosure 100 in accordance with aspects described herein. As shown, the circuit component 110 is surrounded by the enclosure wall 102 (i.e., the internal channel). In one example, the circuit component 110 is positioned at the center of the enclosure base 104 to provide a uniform heat transfer distribution for the circuit component 110. In other words, the circuit component 110 is positioned such that each point along the surface of the circuit component 110 is spaced by an equidistant amount from the enclosure wall 102. As such, heat produced in different areas of the circuit component 110 can be transferred equally to the cooling liquid circulating in the internal channel of the enclosure wall 102.

As will be described in greater detail below, the cooling liquid is circulated through the internal channel of the enclosure wall 102 to transfer heat from the circuit component 110.

Figure 2:
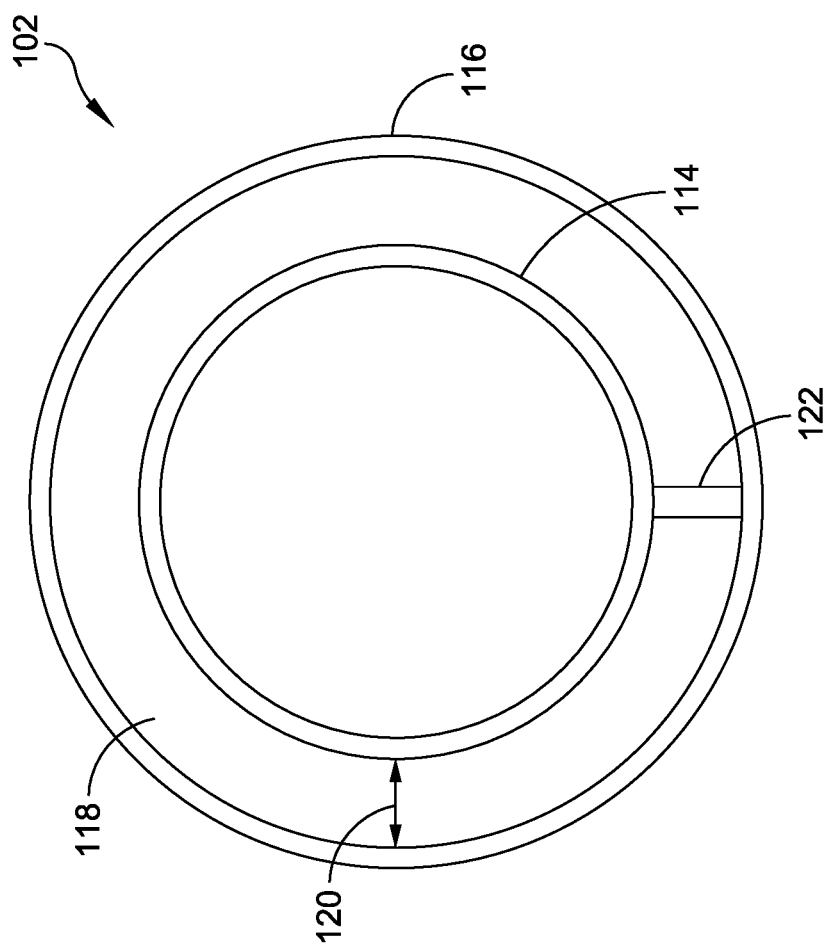
FIG. 2 is a diagram illustrating a top plan view of an enclosure wall according to one embodiment.

FIG. 2 illustrates a top plan view of the enclosure wall 102 in accordance with aspects described herein. As shown, the enclosure wall 102 includes an inner wall 114 and an outer wall 116. In one example, the inner wall 114 and the outer wall 116 are connected to the base 104 (not shown) to form the internal channel 118.

The internal channel 118 has a channel width 120 determined by the spacing of the inner wall 114 and the outer wall 116. In one example, the inner and outer walls 114, 116 are spaced to provide a channel width of about 0.20 inches; however, in other examples, the inner and outer walls 114, 116 can be spaced to provide different channel widths (e.g., about 0.17 inches, about 0.23 inches, etc.). In some examples, the inner and outer walls 114, 116 can be spaced to optimize the channel width 120 based on the type of component to be surrounded by the internal channel 118 (i.e., the circuit component 110). For example, a larger channel width 120 may be desired for higher heat producing components to increase the volume of cooling liquid in the internal channel 118.

As shown, the internal channel 118 includes a barrier 122. In one example, the barrier 122 is positioned within the internal channel 118 to facilitate the circulation of cooling liquid in a desired direction (e.g., clockwise). For example, "relatively cool" or "new" cooling liquid may enter the internal channel 118 on a first side of the barrier 122 and circulate around the circuit component 110. Once the cooling liquid reaches the second side of the barrier 122, the "relatively warm" or "used" cooling liquid may exit the internal channel 118. As such, the barrier 122 prevents the "used" cooling liquid from being re-circulated through the internal channel 118.

The cooling liquid may be one of a number of different types of non-conductive liquids. In this context, "non-conductive" means incapable of conducting electricity at a level that may damage or harm electronics (i.e., the circuit component 110). In some embodiments, the cooling fluid may be an engineered fluid having properties optimized for heat transfer. Examples of cooling liquids that may be used include dielectric fluids, engineered fluids, mineral oils, deionized water, etc.

Figure 3:
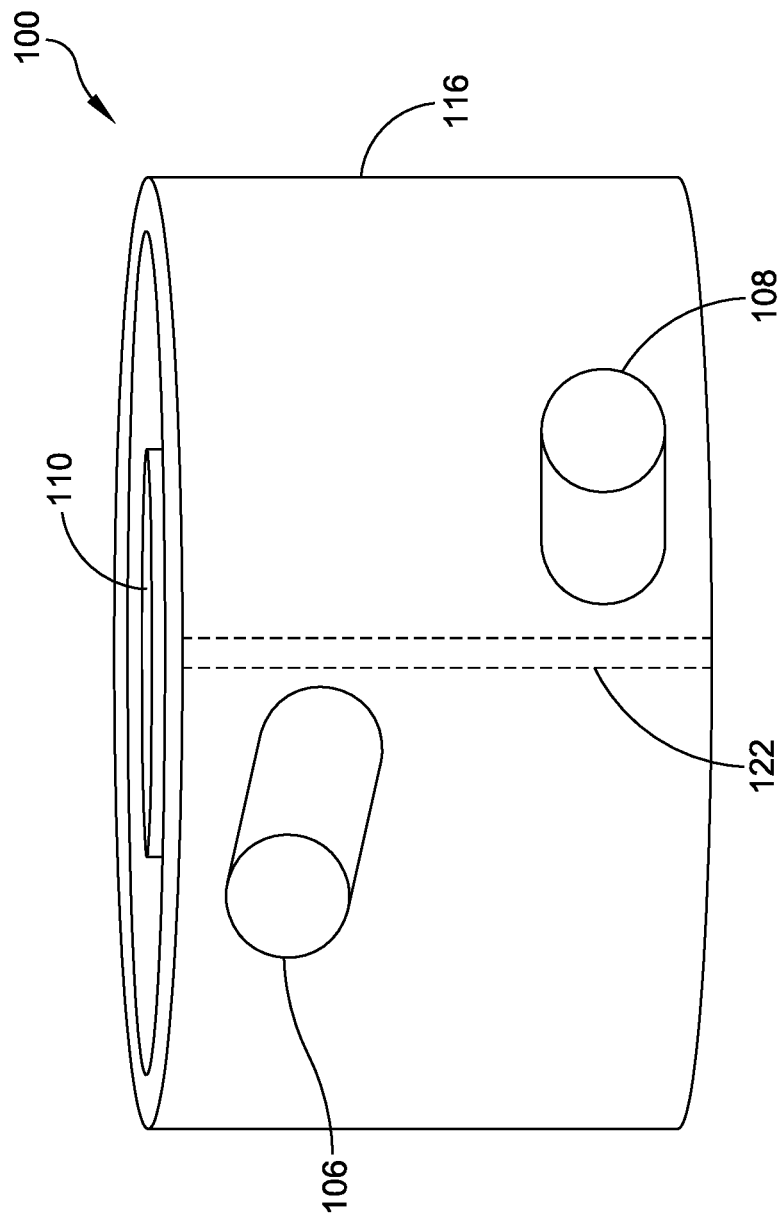
FIG. 3 is a diagram illustrating a side perspective view of a liquid cooling enclosure according to one embodiment.

FIG. 3 illustrates a side perspective view of the liquid cooling enclosure 100 in accordance with aspects described herein. In one example, the inlet 106 is connected to the enclosure wall 102 to provide cooling liquid to the internal channel 118, which is shown in FIG. 2. Likewise, the outlet 108 is connected to the enclosure wall 102 to receive cooling liquid from the internal channel 118. In some examples, the inlet 106 and the outlet 108 can be attached and/or bonded to openings in the outer wall 116 to access the internal channel 118. As shown, the barrier 122 is positioned between the inlet 106 and the outlet 108 to facilitate the flow of cooling liquid in the internal channel 118 and ensure that "used" coolant exits the liquid cooling enclosure 100.

In certain examples, the inlet 106 and/or the outlet 108 can be oriented to assist the flow of cooling liquid. For example, the inlet 106 can be connected to an opening in the outer wall 116 at angle with respect to a first tangent of the outer wall 116. In some examples, the inlet 106 is connected to the outer wall 116 through an inlet opening formed at a non-perpendicular angle with respect to the first tangent of the outer wall 116. Likewise, the outlet 108 can be connected to an opening in the outer wall 116 at an angle with respect to a second tangent of the outer wall 116. In some examples, the outlet 108 is connected to the outer wall 116 through an outlet opening formed at a non-perpendicular angle with respect to the second tangent of the outer wall 116. As such, the cooling liquid may enter and/or exit the internal channel 118 on a downward slope, promoting the circulation of cooling liquid through the internal channel 118 (i.e., via gravity).

While the liquid cooling enclosure 100 shown in FIGS. 1-3 has a cylindrical "cup" shape, it should be appreciated that the enclosure 100 can be configured with different shapes. For example, the enclosure 100 may be configured with a rectangular "cup" shape. In some examples, the shape of the enclosure 100 may correspond to the type of circuit component(s) being housed within the enclosure 100. In certain examples, the cooling liquid is provided with a desired amount of pressure (e.g., via a pump) based on the shape of the enclosure 100 and the associated resistance of the internal channel.

Figure 4:
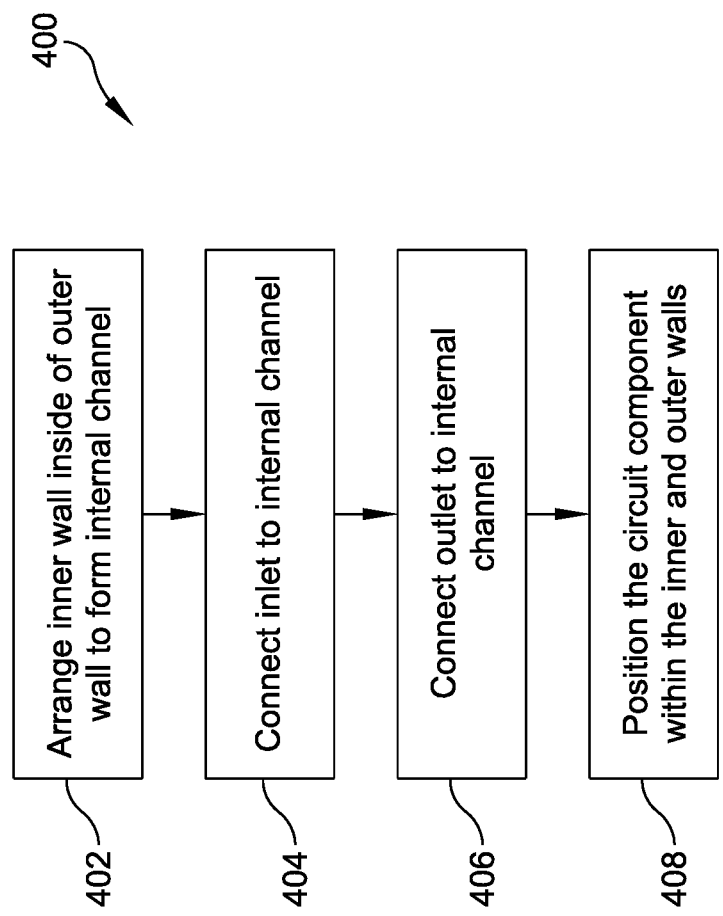
FIG. 4 is a diagram illustrating a method of assembling a liquid cooling enclosure according to one embodiment.

FIG. 4 illustrates a method of assembling a liquid cooling enclosure. The method, generally indicated at 400, includes assembling a liquid cooling enclosure configured to house one or more circuit components. In one embodiment, the method 400 may be utilized to assemble the liquid cooling enclosure 100, for example.

At step 402, the inner wall 114 is arranged inside of the outer wall 116 to form the internal channel 118. In one example, the inner and outer walls 114, 116 have substantially the same shape and the circumference of the inner wall 114 is smaller than the circumference of the outer wall 116. As described above, the inner and outer walls 114, 116 may be arranged to provide a desired internal channel width.

In some examples, the inner and outer walls 114, 116 are optionally connected to the base 104 to form the "cup" shaped structure that houses a circuit component 110. The inner wall 114 and/or the outer wall 116 may be bonded, fastened, welded, or otherwise attached to the base 104.

At step 404, the inlet 106 is connected to the internal channel 118. As described above, the inlet 106 can be attached to an opening in the outer wall 116 to access the internal channel 118. In some examples, inlet 106 is configured to provide a cooling liquid to the internal channel 118. Likewise, at step 406 the outlet 108 is connected to the internal channel 118. The outlet 108 can be attached to an opening in the outer wall 116 to access the internal channel 118. In some examples, the outlet 108 is configured to return the cooling liquid after passing through the internal channel 118. In certain examples, the inlet 106 and/or the outlet 108 can be connected to the openings in the outer wall 116 with a leak-proof seal to minimize loss when transferring cooling liquid to/from the internal channel 118.

At step 408, the circuit component 110 is positioned within the inner and outer walls 114, 116. In one example, the circuit component 110 is positioned within the inner and outer walls 114, 116 at the base 104. In some examples, the circuit component 110 is positioned such that cooling liquid is circulated around the circuit component 110 via the internal channel 118.

In certain examples, the circuit component 110 is optionally surrounded by a thermally conductive epoxy to thermally couple the circuit component 110 to the inner wall 114 (i.e., the internal channel 118). In some examples, the epoxy is also utilized to stabilize the component within the enclosure 100.

Figure 5:
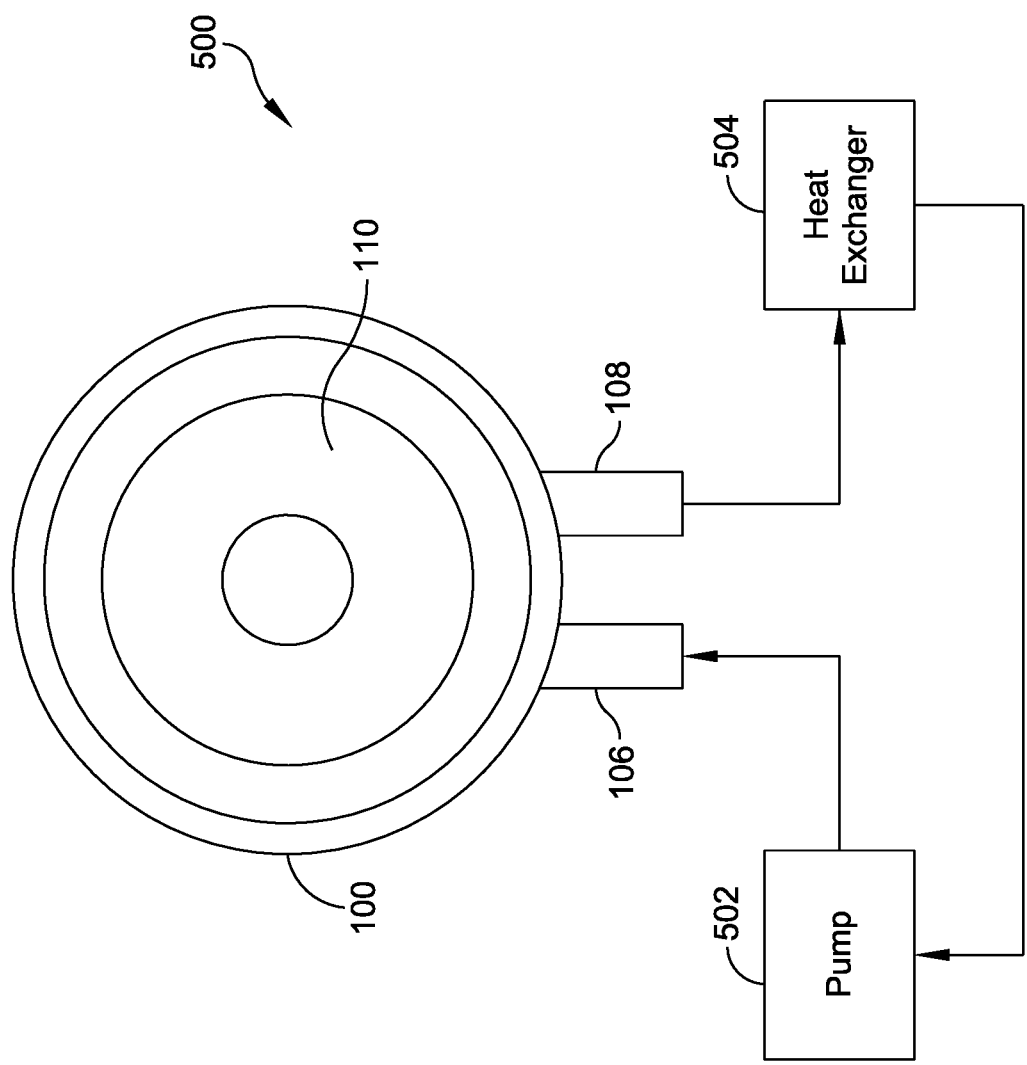
FIG. 5 is a diagram illustrating a liquid cooling system including a liquid cooling enclosure according to one embodiment.

FIG. 5 illustrates a liquid cooling system generally indicated at 500 in accordance with aspects described herein. In one example, the liquid cooling system 500 includes a pump 502, a heat exchanger 504, and the liquid cooling enclosure 100. As shown, the pump 502 is connected to the inlet 106 of the enclosure 100 and the heat exchanger 504 is connected to the outlet 108 of the enclosure 100. In some examples, the enclosure 100, the pump 502, and the heat exchanger 504 are connected using plastic tubing or hoses configured to carry the cooling liquid. In other examples, the tubing or hoses can be made from an insulating material configured to absorb heat from the cooling liquid.

In one example, the pump 502 includes a pump control module configured to operate the pump 502 to transfer cooling liquid from a liquid reservoir (not shown) into the enclosure 100 via the inlet 106. In certain examples, the pump control module can receive commands from a computing system, another control module, and/or a user. In some examples, the pump control module is configured to operate the pump 502 with a volumetric flow rate corresponding to the circuit component 110. For example, a larger volumetric flow rate may be used for higher heat producing components compared to lower heat producing components. In other examples, the volumetric flow rate may be determined based on parameters of the cooling liquid (e.g., density, thermal variations, etc.).

The cooling liquid is circulated through the internal channel 118 of the enclosure 100 and returned to the outlet 108. The outlet 108 provides the cooling liquid to the heat exchanger 504, and the heat exchanger 504 cycles the cooling liquid to transfer heat generated by the circuit component 110. Water, or another liquid, such as refrigerant, may be circulated through the heat exchanger 504 to remove heat from the cooling fluid. In some examples, the heat exchanger 504 is connected to the pump 502 and the cooling liquid can be returned to the pump 502 once the heat has been removed by the heat exchanger 504. In other examples, the heat exchanger 504 may be configured to return the cooling liquid to a different location/component (e.g., the fluid reservoir).

Figure 6:
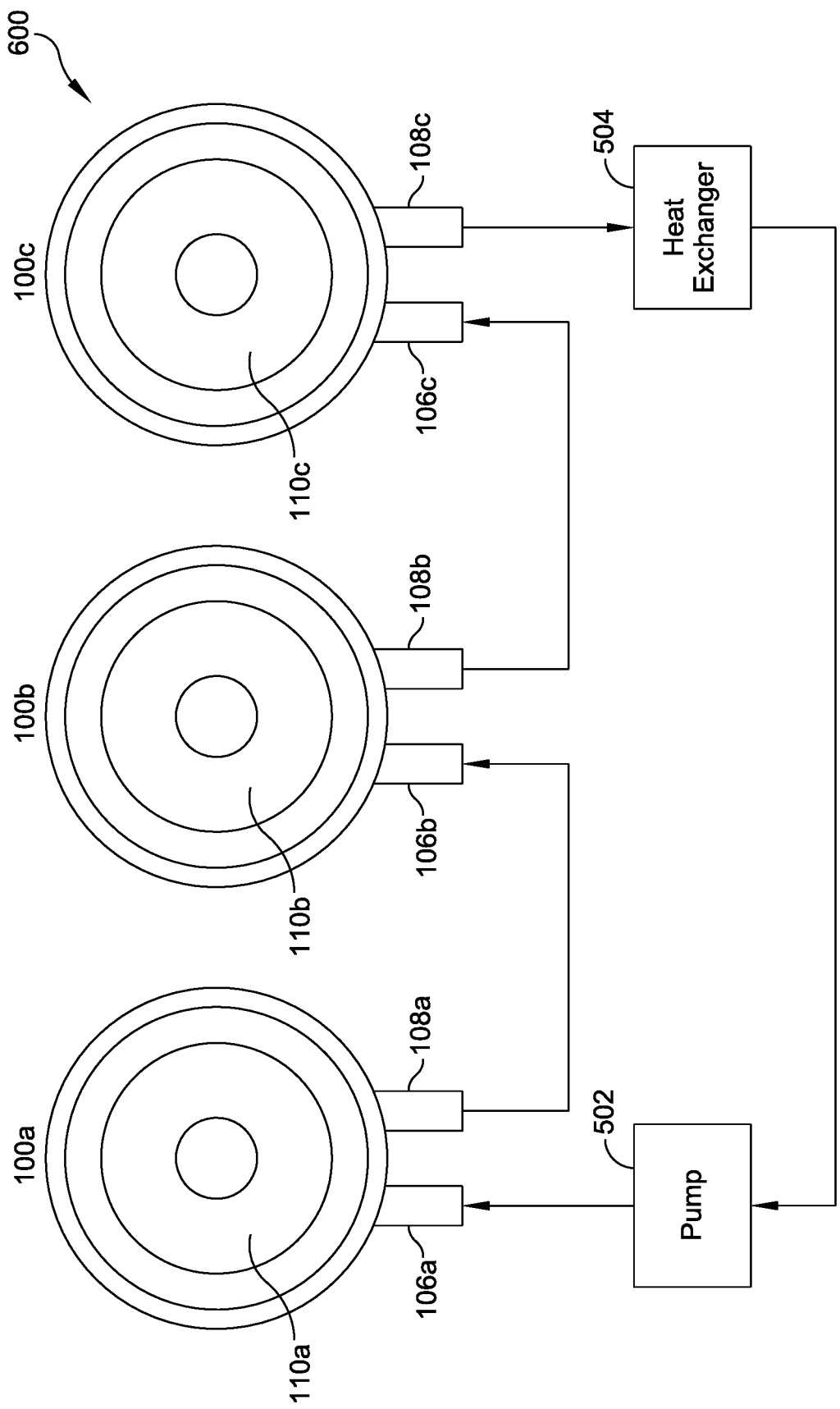
FIG. 6 is a diagram illustrating a liquid cooling system including a plurality of liquid cooling enclosures according to one embodiment.

FIG. 6 illustrates a liquid cooling system generally indicated at 600 in accordance with aspects described herein. In one example, the liquid cooling system 600 is substantially the same as the liquid cooling system 500 of FIG. 5, except the liquid cooling system 600 includes multiple liquid cooling enclosures. As shown, in one embodiment, the liquid cooling system 600 includes a first liquid cooling enclosure 100a housing a first circuit component 110a, a second liquid cooling enclosure 100b housing a second circuit component 110b, and a third liquid cooling enclosure 100c housing a third circuit component 110c. In other examples, the liquid cooling system 600 can be configured to include a different number of enclosures/components.

In one example, the enclosures 100a, 100b, 100c are daisy-chained together between the pump 502 and the heat exchanger 504. The inlet 106a of the first enclosure 100a is connected to the pump 502 and the outlet 108a of the first enclosure 100a is connected to the inlet 106b of the second enclosure 100b. Likewise, the outlet 108b of the second enclosure 100b is connected to the inlet 106c of the third enclosure 100c and the outlet 108c of the third enclosure 100c is connected to the heat exchanger 504. As such, the cooling liquid is provided from the pump 502 to each of the enclosures 100a, 100b, and 100c in series before being returned to the heat exchanger 504.

In some examples, the enclosures 100a, 100b, and 100c can be arranged based on the types of circuit components housed by each enclosure. For example, the circuit component 110a housed by the first enclosure 100a may correspond to the highest heat generating component, the circuit component 110b housed by the second enclosure 100b may correspond to the second highest heat generating component, and so on. In other words, the enclosures 100a, 100b, and 100c may be arranged such that the highest heat generating circuit components (e.g., 110a) receive the "new" cooling liquid provided from the pump 502 before the lower heat generating components (e.g., 110b, 110c).

As described above, an improved liquid cooling enclosure for circuit components is provided herein. In at least one embodiment, the enclosure includes an internal channel that surrounds one or more circuit components positioned at the base of the enclosure. In some examples, a cooling liquid is circulated around the one or more circuit components via the internal channel to transfer heat generated by the one or more circuit components.

Having thus described several aspects of at least one embodiment of this invention, it is to be appreciated various alterations, modifications, and improvements will readily occur to those skilled in the art. Such alterations, modifications, and improvements are intended to be part of this disclosure and are intended to be within the spirit of and

What is claimed is:

1. A liquid cooling enclosure configured to house and cool at least one circuit component, the liquid cooling enclosure comprising:
an inner wall;
an outer wall, the outer wall being spaced from the inner wall to form an internal channel;
an inlet in fluid communication with the internal channel, the inlet being configured to receive cooling liquid; and
an outlet in fluid communication with the internal channel, the outlet being configured to return cooling liquid,
wherein the at least one circuit component is surrounded by the inner wall, and
wherein the inlet is connected to the outer wall through an inlet opening formed at a non-perpendicular angle with respect to a tangent of the outer wall at a center of the inlet opening.

2. The liquid cooling enclosure of claim 1, wherein at least one of the inner wall or the outer wall is fabricated from aluminum.

3. The liquid cooling enclosure of claim 1, wherein a first circumference of the inner wall is less than a second circumference of the outer wall.

4. The liquid cooling enclosure of claim 1, wherein the inner wall is configured to be thermally coupled to the at least one circuit component.

5. The liquid cooling enclosure of claim 1, wherein the inner wall is configured to be thermally coupled to the at least one circuit component using a thermally conductive epoxy.

6. The liquid cooling enclosure of claim 1, further comprising an enclosure base connected to the inner wall and the outer wall.

7. The liquid cooling enclosure of claim 6, wherein the at least one circuit component is configured to be positioned within the liquid cooling enclosure on the enclosure base.

8. The liquid cooling enclosure of claim 6, wherein at least one side of the enclosure base is configured to be thermally coupled to at least one of the inner wall, the outer wall, or the at least one circuit component.

9. The liquid cooling enclosure of claim 6, wherein at least one side of the enclosure base is configured to be secured to at least one of a cold plate or a printed circuit board.

10. The liquid cooling enclosure of claim 1, wherein the outlet is configured to be connected to a heat exchanger.

11. The liquid cooling enclosure of claim 1, wherein the outlet is configured to be connected to an inlet of a second liquid cooling enclosure.

12. A liquid cooling enclosure configured to house and cool at least one circuit component, the liquid cooling enclosure comprising:
an inner wall;
an outer wall, the outer wall being spaced from the inner wall to form an internal channel;
an inlet in fluid communication with the internal channel, the inlet being configured to receive cooling liquid; and
an outlet in fluid communication with the internal channel, the outlet being configured to return cooling liquid,
wherein the at least one circuit component is surrounded by the inner wall, and
wherein the outlet is connected to the outer wall through an outlet opening formed at a non-perpendicular angle with respect to a tangent of the outer wall at a center of the outlet opening.

13. A method of assembling a liquid cooling enclosure configured to house at least one circuit component, the method comprising:
arranging a first wall inside of a second wall to form an internal channel;
connecting an inlet to the internal channel, the inlet being configured to provide a cooling liquid to the internal channel; and
connecting an outlet to the internal channel, the outlet being configured to return the cooling liquid after passing through the internal channel,
wherein the at least one circuit component is surrounded by the first wall, and
wherein the inlet is connected to the internal channel through an inlet opening formed at an angle with respect to a tangent of the outer wall.

14. The method of claim 13, further comprising thermally coupling the at least one circuit component to the first wall.

15. The method of claim 13, further comprising connecting the first and second walls to an enclosure base.

16. The method of claim 15, further comprising thermally coupling the enclosure base to at least one of first wall, the second wall, or the at least one circuit component.

17. The method of claim 15, further comprising securing an enclosure base to at least one of a cold plate or a printed circuit board.

18. The method of claim 13, further comprising connecting the inlet to at least one pump configured to circulate the cooling liquid through the internal channel.

19. The method of claim 13, further comprising connecting the outlet to a heat exchanger configured to transfer heat generated by the at least one circuit component from the cooling liquid.

20. The method of claim 13, further comprising connecting the outlet to an inlet of a second liquid cooling enclosure.

21. A method of assembling a liquid cooling enclosure configured to house at least one circuit component, the method comprising:
arranging a first wall inside of a second wall to form an internal channel;
connecting an inlet to the internal channel, the inlet being configured to provide a cooling liquid to the internal channel; and
connecting an outlet to the internal channel, the outlet being configured to return the cooling liquid after passing through the internal channel,
wherein the at least one circuit component is surrounded by the first wall, and
wherein the outlet is connected to the internal channel through an outlet opening formed at an angle with respect to a tangent of the outer wall.

22. A liquid cooling system for cooling a plurality of circuit components, the liquid cooling system comprising:
a pump configured to provide cooling liquid;
a heat exchanger configured to transfer heat generated by the plurality of circuit components from the cooling liquid; and
a plurality of liquid cooling enclosures connected in series, each liquid cooling enclosure including an inlet configured to receive cooling liquid, an internal channel configured to circulate cooling liquid around at least one circuit component of the plurality of circuit components, and an outlet configured to return cooling liquid,
wherein the pump is connected to the inlet of a first liquid cooling enclosure of the plurality of liquid cooling enclosures and the heat exchanger is connected to the outlet of a second liquid cooling enclosure of the plurality of liquid cooling enclosures.

\* \* \* \* \*